United States Patent [19]

Itoh et al.

[11] Patent Number: 4,759,951

[45] Date of Patent: Jul. 26, 1988

[54] HEAT-TREATING CD-CONTAINING PHOTOELECTRIC CONVERSION FILM IN THE PRESENCE OF A CADMIUM HALIDE

[75] Inventors: Masataka Itoh, Nara; Masaya Nagata, Tenri; Shuhei Tsuchimoto, Nara; Atsushi Yoshinouchi, Nara; Hiroshi Wada, Nara; Katsushi Okibayashi, Sakurai; Soji Ohhara, Kashihara, all of Japan

[73] Assignee: Sharp Kabushiki Kaisha, Osaka, Japan

[21] Appl. No.: 910,875

[22] Filed: Sep. 23, 1986

[30] Foreign Application Priority Data

| | | | |
|---|---|---|---|
| Sep. 25, 1985 | [JP] | Japan | 60-213453 |
| Sep. 26, 1985 | [JP] | Japan | 60-215913 |
| Sep. 30, 1985 | [JP] | Japan | 60-218631 |
| Oct. 18, 1985 | [JP] | Japan | 60-235084 |
| Oct. 22, 1985 | [JP] | Japan | 60-236805 |

[51] Int. Cl.⁴ .......................... B05D 5/12; H01L 31/00

[52] U.S. Cl. .......................................... 427/76; 427/74; 427/333; 136/260; 136/264

[58] Field of Search ........................... 427/74, 76, 333; 423/508, 509; 136/260, 264

[56] References Cited

U.S. PATENT DOCUMENTS

| | | | |
|---|---|---|---|
| 3,377,200 | 7/1964 | Chamberlin et al. | 427/76 |
| 3,598,645 | 8/1971 | Winter | 427/76 |
| 4,034,127 | 7/1977 | Busanovich et al. | 427/76 |
| 4,362,896 | 12/1982 | Singh | 136/260 |

*Primary Examiner*—Michael R. Lusignan
*Assistant Examiner*—Margaret Burke
*Attorney, Agent, or Firm*—Stiefel, Gross & Kurland

[57] ABSTRACT

A process for producing a photoelectric conversion film comprising heat-treating a coating (A) of a photoconductive material composed chiefly of at least one of CdSe, CdS, CdTe, $CdS_xSe_{1-x}$ and $CdS_xTe_{1-x}$ wherein x is a real number of less than 1, opposite from a coating (B) in proximity thereto, the coating (B) being made of a material composed chiefly of CdS and a Cd halide.

10 Claims, 4 Drawing Sheets

3

4

2

1

O2. pressure vs output

HEAT-TREATING CD-CONTAINING PHOTOELECTRIC CONVERSION FILM IN THE PRESENCE OF A CADMIUM HALIDE

BACKGROUND OF THE INVENTION

1. Field of the Invention

The present invention relates to a process for producing a photoelectric conversion film suitable, for example, for use in the reader unit of facsimile systems, and more particularly to a process for producing a photoelectric conversion film having improved image signal output characteristics and also improved photoresponse characteristics for realizing a real time image reading system.

2. Description of the Prior Art

Conventionally, photodetectors, such as CCDs and MOS sensors, which are fabricated by IC techniques have been used, for example, for the reader unit of facsimile systems.

However, such detectors are limited only to several tens of millimeters in length since they are prepared by IC techniques, so that in actual use, there is a need to form an image of the original on a reduced scale. To form images on a reduced scale, there arises a need to use a lens of substantial optical path length, and the detector must be positioned generally at a distance of 20 to 30 cm from the original. The great optical path length poses a serious problem in providing a compacted lightweight reader unit.

In contrast with the photodetector for use in such a scale reduction system, a contact-type image sensor has been proposed in recent years which has the same width as the document and which is provided with a fiber optic lens array thereon for forming an image of the original at a magnification of 1X.

While a $CdS_xSe_{1-x}$ mixed-crystal film formed by vacuum evaporation, a Si film or the like is used for the photoelectric conversion portion of the image sensor, these films, which are prepared by a vacuum process, are costly and still remain to be improved in productivity, yield, etc.

On the other hand, a process for producing a photoelectric conversion film relatively inexpensively is known which comprises preparing slurry of finely ground cadmium sulfide crystals and/or finely ground cadmium selenide crystals, a small amount of activating impurities, flux and organic binder, coating a substrate with the mixture and baking the coated substrate in nitrogen gas or in a nitrogen gas atmosphere containing a trace (0.3%) of oxygen gas (for example, as disclosed in Examined Japanese patent publication SHO No. 52-25305).

Although this process affords photoelectric conversion films relatively inexpensively and with good reproducibility, the process is unable to prepare photoelectric conversion films which are outstanding in image signal output characteristics and in photoresponse characteristics for realizing real time image reading systems. In fact, it has been difficult to use the film obtained by the process for the facsimile reader unit which must handle a large number of picture elements as arranged with a high density.

On the other hand, a $CdS_xSe_{1-x}$ film prepared from a solid solution of CdS and CdSe crystals in an optional ratio, for example, is used as the photoelectric conversion film of the contact-type image sensor. Nevertheless, the spectral sensitivity characteristics and photoresponse speed vary chiefly with this ratio. As the proportion of CdSe in the solid solution increases, the photoresponse speed increases, but the peak of spectral sensitivity shifts from 520 nm toward 720 nm off the center of the visible region. Pure CdSe has peak spectral sensitivity around 725 nm and is chiefly sensitive to red rays generally. Accordingly, when there is a need to read red character images, the film is not serviceable as a suitable photoelectric conversion element. In contrast, pure CdS is suitable for reading red character images but has the drawback of being lower than CdSe in photoresponse speed.

Thus there is a tendency for photoresponse to be in conflict with the spectral sensitivity characteristics, and there remains the problem that even if the solid solution has a suitable ratio, the photoelectric conversion film then available is always intermediate in respect to both the characteristics.

To solve the above problem, heat-treating methods are known for activating photoelectric conversion film. For example, an earthen cover is coated over the inner surface with an activating powder of CdS, Cd halide or the like in the form of a sintered coating, and the conversion film to be activated is heat-treated as enclosed with the cover. Examined Japanese patent publication SHO No. 58-46194 discloses another method wherein a powder prepared from a mixture of finely ground CdS and a Cd halide by calcining and pulverizing the mixture is placed on the bottom of a hermetic or semi-hermetic container, and the conversion film is heat-treated as placed within the container.

However, the former method, for example, has the problem that it is difficult to form a sintered coating of activating powder on the inner surface of the earthen cover, hence poor reproducibility.

The latter method requires a special hermetic or semi-hermetic container and has the problem that when the films to be activated are arranged in many stages within the container, spots occur on the surface of the films owing to an uneven flow of the activating vapor. The method has another problem in that a large amount of CdS or Cd halide needs to be used for each batch.

SUMMARY OF THE INVENTION

The present invention provides a process for producing a photoelectric conversion film comprising heat-treating a coating (A) of a photoconductive material composed chiefly of at least one of CdSe, CdS, CdTe, $CdS_xSe_{1-x}$ and $CdS_xTe_{1-x}$ wherein x is a real number of less than 1, opposite from a coating (B) in proximity thereto, the coating (B) being made of a material composed chiefly of CdS and a Cd halide.

The present invention improves the conventional activating heat-treating methods and achieves an improved activation efficiency by a very simple arrangement to provide a process for producing photoelectric conversion films with high stability and good reproducibility.

The present process provides a photoelectric conversion film which is suitably controlled in the growth of particles and in surface roughness and which produces a high output with good stability.

DESCRIPTION OF THE PREFERRED EMBODIMENTS

Figure 1:
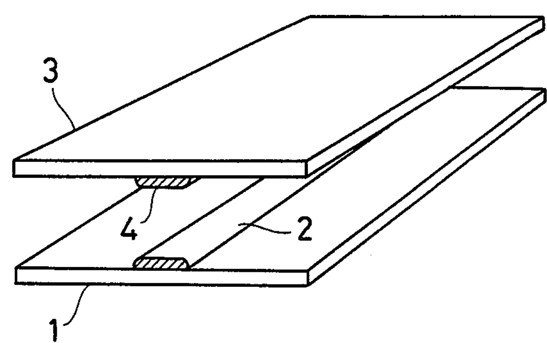
FIG. 1 is a diagram showing a process embodying the invention for producing a photoelectric conversion film.

In the process of the present invention for producing a photoelectric conversion film, a coating A of photoconductive material is formed on an insulating substrate (such as a glass or ceramic substrate measuring, for example, 30 cm×240 cm) as by screen printing. The coating A has a suitable width and a suitable length (for example, 1.0–3.0 mm×220–230 mm).

The photoconductive material is composed chiefly of at least one of CdSe, CdS, CdTe, $CdS_xSe_{1-x}$ and $CdS_xTe_{1-x}$ wherein x is preferably 0.2 to 0.4, for example. Among these components, CdSe is most commonly used. Preferably, these components are used in the form of fine particles, for example, 0.5 μm in particle size. It is also desirable to use these components as activated by being heat-treated (for example, at 600° to 900° C.).

Conjointly used with the photoconductive material are a Cd halide (for example, in an amount of 3 to 6 mole % based on the main component) serving as a flux and a glass powder (for example, in an amount of 8 to 15 wt. % based on the paste eventually obtained) having a low melting point and serving as a binder. Also used is a suitable amount of thickener (such as α-terpineol and ethylcellulose). These materials are fully mixed together into a paste, which is then applied to the substrate and dried by being heated in an inert gas (e.g. $N_2$ gas) at about 100° C., whereby the coating A is prepared. The coating A is preferably about 10 to about 20 μm in thickness.

On the other hand, a coating B composed chiefly of CdS and a Cd halide is formed in the same manner as the coating A on a substrate similar to the one used for the coating A.

The Cd halide is used in an amount of 1 to 10 mole %, preferably 3 to 5 mole %, based on CdS. Examples of useful Cd halides are $CdCl_2$, $CdBr_2$ and $CdI_2$, among which $CdCl_2$ is desirable. Preferably, these main components are used in the form of fine particles. Such main components are made into a paste with use of a suitable thickener.

It is desired that the coating B have approximately the same size as the coating A or a slightly larger size. The coating B is about 10 to about 20 μm in thickness.

As one of the features of the process of the present invention, the two coatings A and B are arranged opposite from each other in proximity to each other. This means that the two coatings are so positioned relative to each other that the vapor released from the coating B will be deposited on the surface of the coating A to form a thin layer. Stated more specifically, this arrangement includes the case wherein the two coatings are opposite from each other face-to-face at a distance of 0.1 to 10 mm, preferably 0.4 to 0.8 mm, therebetween.

The temperature suitable for heat-treating the coating A is generally in the range of from 430° C. to 550° C. A particular temperature within this range can be used. However, we have found it desirable to conduct the heat treatment in two divided stages, i.e., first at a low temperature of 430° C. to 500° C. and thereafter at a high temperature of 480° C. to 550° C. It is thought that when the heat treatment is thus conducted in two divided stages, the particles are bound to one another in the first stage while being mainly grown in this stage, the second stage serving to mitigate the disturbance of the lattice in the surface while inhibiting the growth of the particles and to remove the excessive unreacted components. We have found that this mode of heat treatment produces more desirable photoelectric conversion films.

The heat treatment is carried out either in an inert gas or an atmosphere containing oxygen. We have found that improved results are achievable when the heat treatment is conducted in two divided stages, i.e., first in an oxygen-containing gas and subsequently in an inert gas. The oxygen partial pressure of the oxygen-containing gas is suitably ¼ to 1/20, preferably 1/5 to 1/10. Examples of useful inert gases are $N_2$, Ar, He and the like, among which $N_2$ gas is generally used.

It will be understood that to form such a heat-treating atmosphere, the heat treatment of the present invention is carried out using an apparatus which has a heater and which is separable from the outside air while passing the above gas through the apparatus from inlet to outlet. However, it is desirable to use a vacuum heat-treating oven with the interior air completely replaced by the gas. While the treating time is dependent on the temperature, the heat treatment is conducted usually for about 1 to 2 hours.

The heat treatment forms a very thin (e.g. tens to hundreds of angstroms) CdS layer over the coating A, consequently affording a photoelectric conversion film which is outstanding in photoresponse speed and spectral sensitivity characteristics.

When the photoelectric conversion film of the present invention has formed thereon a planar electrode assembly having an electrode-to-electrode spacing of 50 μm, electrode width of 60 μm and electrode pitch of 125 μm (8 electrodes/mm), an array of 1728 picture elements can be obtained for use in a facsimile scanner or like reading unit for reading originals of A4 size.

The present invention will be further described with reference to the following example.

EXAMPLE 1

FIG. 1 is a diagram showing an arrangement of substrates for illustrating the surface (activating) treatment which is included in an embodiment of the process of the invention for producing a photoelectric conversion film. FIG. 1 shows a substrate 1 for a photoelectric conversion device, a CdSe coating 2 formed on the substrate 1, a substrate 3 for a surface (activating) treatment mixture, and the mixture 4, i.e., a coating 4 formed on the substrate 3 and prepared from a mixture of CdS and a Cd halide serving as a flux for CdS.

The CdSe coating 2 is prepared from a CdSe powder 0.5 μm in mean particle size and heat-treated for activation, 4.5 mole %, based on the CdSe powder, of $CdCl_2$ serving as a flux for the powder, 10 wt. % of low-melting glass frit having a glass transition point of 400° C., and a suitable amount of α-terpineol containing a small amount of ethylcellulose, by fully mixing these materials together into a coating paste, applying the paste to the glass substrate 1 by screen printing (over an area of 230 mm in length and 2 mm in width) and thereafter drying the applied paste in an $N_2$ gas atmosphere at 100° C. for 30 minutes.

Similarly, the mixture coating 4 is prepared from a CdS powder, $CdCl_2$ (in an amount of 5 mole % based on the CdS powder) serving as a flux therefor and a suitable amount of α-terpineol containing a small amount of ethylcellulose, by thoroughly mixing these materials into a coating paste, applying the paste to the glass substrate 3 by screen printing (over an area of 240 mm×3 mm) and thereafter drying the applied paste in an $N_2$ gas atmosphere at 100° C. for 30 minutes.

The CdSe coating 2 and the CdS coating 4 thus prepared are opposite from each other face-to-face in proximity to each other (with a gap of 0.5 mm therebetween) as seen in FIG. 1 and then heat-treated first at 300° C. to remove the ethylcellulose from the thickener and subsequently at 500° C. for 1 hour.

During the heat treatment, $CdCl_2$ acts as a flux, permitting the CdSe particles to melt over the surface and to fuse to one another to form larger particles, with the result that a heat-treated film 5 is completed which is composed of agglomerates of particles of 2 to 3 μm in mean particle size. During the heat treatment, a very thin (hundreds of angstroms) CdS layer 6 is formed, simultaneously with activation, over the surface of the CdSe layer to be used as a photoelectric conversion film.

Figure 2:
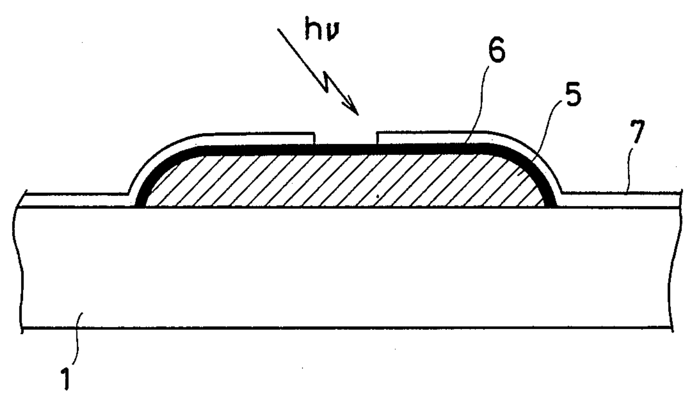
FIG. 2 is a diagram showing the structure of an example of photoelectric conversion device having the photoelectric conversion film obtained by the process of the invention.

As seen in FIG. 2, a planar electrode assembly 7 is formed by the lift-off method over the photoelectric conversion film thus obtained to provide a photoelectric conversion device, the electrode assembly 7 having an electrode-to-electrode spacing of 50 μm, an electrode width of 60 μm and an electrode pitch of 125 μm.

Figure 3:
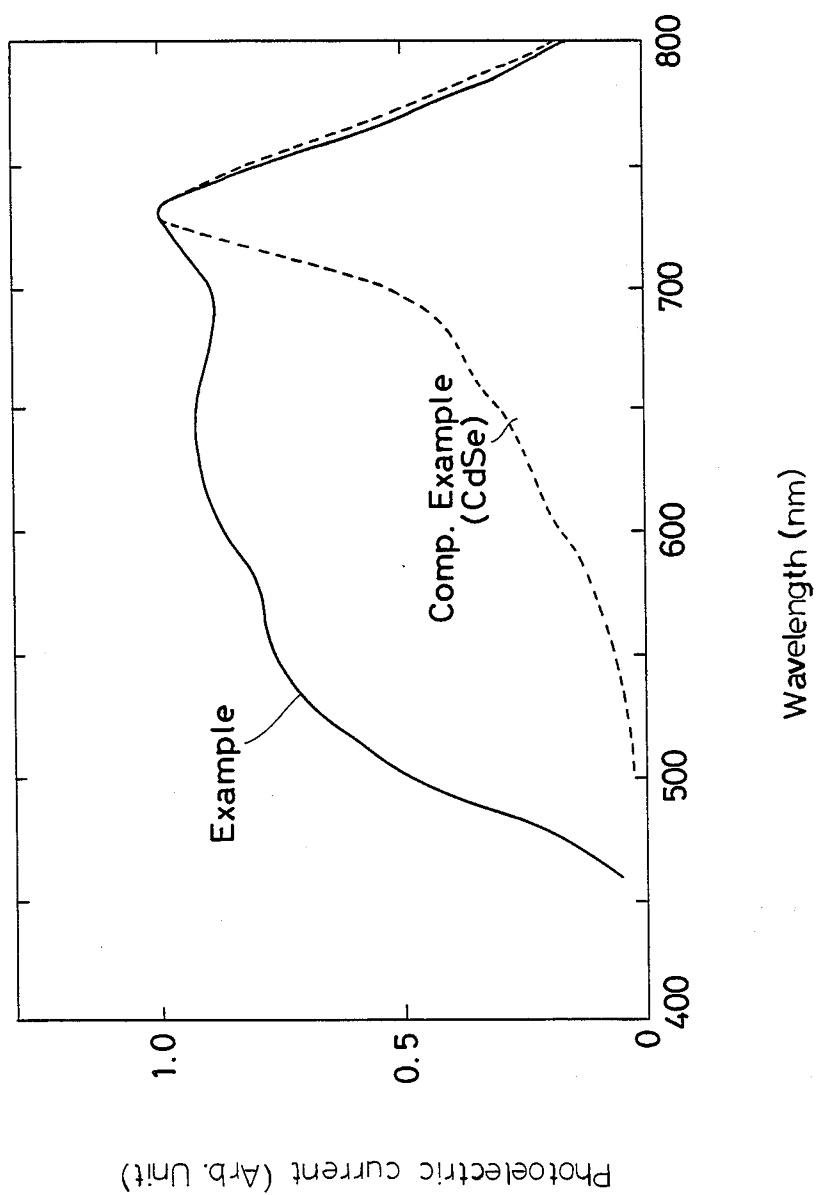
FIG. 3 is a graph showing the spectral sensitivity characteristics of the photoelectric conversion film obtained according to the invention.

FIG. 3 shows the spectral sensitivity characteristics of the photoelectric conversion device thus fabricated.

With reference to FIG. 3, the spectral sensitivity characteristics of a conventional CdSe film are represented by a broken line, and those of the surface-treated CdSe film of the invention by a solid line.

FIG. 3 reveals that the surface-treated CdSe film has outstanding spectral sensitivity characteristics.

Figure 4:
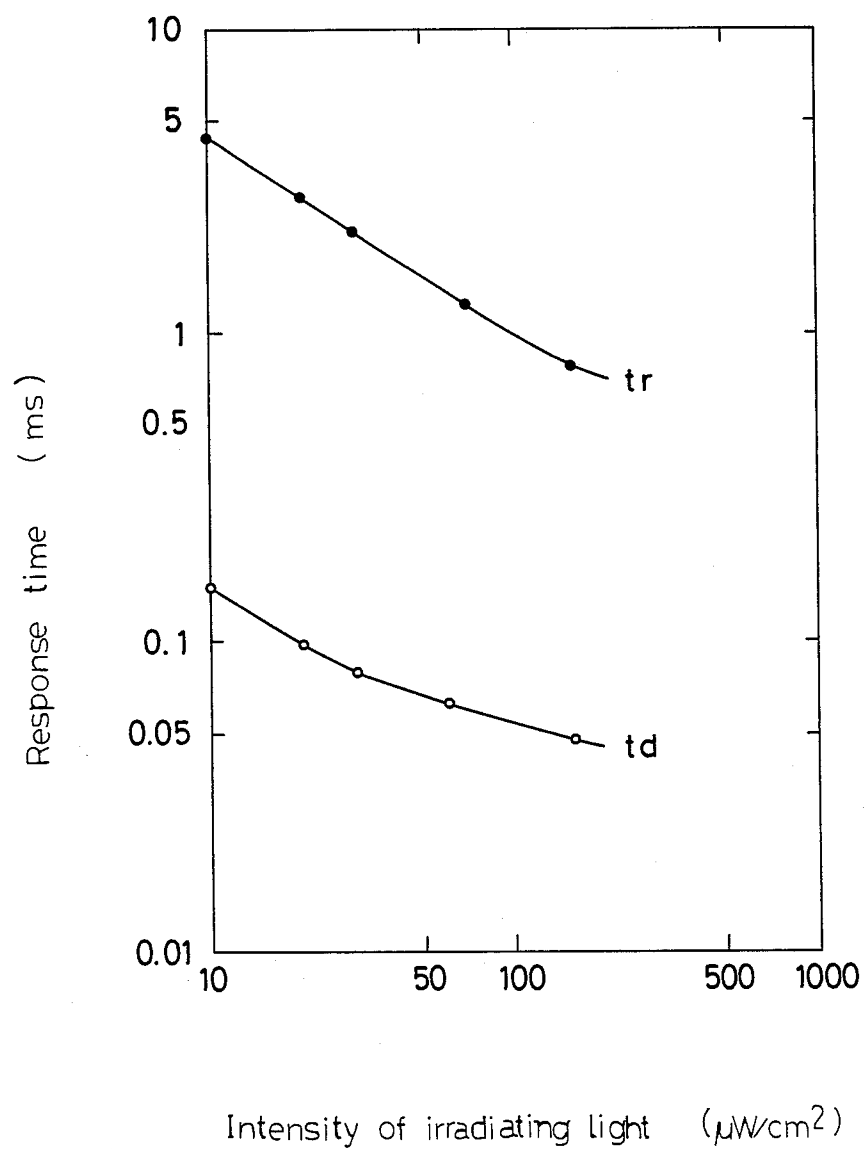
FIG. 4 is a graph showing the relation between the intensity of irradiating light and the time taken for the film to respond to the light.

FIG. 4 shows the relation between the intensity of irradiating light and the time taken for the surface-treated CdSe film to respond to the light. The response time is expressed in terms of the rise time tr required for the photocurrent produced by the light irradiating the photoelectric conversion device to reach 50% of the steady-state current value, and also in terms of the decay time td taken for the steady-state current to decay to 50% of the value after the irradiating light is blocked. There is no difference in response time between the surface-treated CdSe film and the untreated CdSe film, so that the surface treatment produces no adverse effect on the response time. FIG. 4 shows that the device is fully satisfactory in response time.

EXAMPLE 2

A photoconductive film 2 of $CdS_{0.2}Se_{0.8}$ is prepared. Each of CdS and CdSe used as a photoconductive material for forming this film is in the form of fine particles prepared by the chemical deposition process, followed by heat treatment (at 800° to 900° C.) for activation. The particulate CdS and CdSe are mixed together, a low-melting glass and a halide are admixed with the mixture, and the resulting mixture is made into a paste with addition of an organic solvent. The paste is applied to a substrate by screen printing to obtain the film 2. Stated more specifically, the film 2 is prepared from a CdS-CdSe fine crystal mixture (1:4 in mole ratio) by admixing a low-melting glass (in an amount of 2 wt. % based on the mixture) and 8 mole % of $CdCl_2$ with the mixture, making the resulting mixture into a paste with addition of α-terpineol containing a small amount of ethylcellulose, and coating a glass substrate, 30 mm×250 mm, with the paste by screen printing to a thickness of 10 to 20 μm over an area of 2 mm in width and 230 mm in length. Similarly, a paste is prepared from CdS fine crystals, $CdCl_2$ in an amount of 5 mole % based on the CdS and a suitable amount of α-terpineol containing a small amount of ethylcellulose, and the paste is printed on a glass substrate over an area of 3 mm in width and 240 mm in length.

The coatings on the substrates are dried at 100° C. to evaporate the α-terpineol off. Subsequently, the substrates are arranged close to each other, with the coatings opposite from each other face-to-face, and the photoconductive coating is heat-treated at a temperature of 450° to 550° C. for activation while exposing the arrangement to a nitrogen-oxygen gas mixture which is fed at a low rate of 1 to 10 liters/min.

When the oxygen partial pressure for the heat treatment is lowered, the growth of particles is inhibited to result in a reduced photocurrent output, whereas an increased oxygen partial pressure promotes the growth of particles but impairs the surface roughness of the film to be obtained to entail a lower yield, for example, when an electrode is formed thereon.

Figure 5:
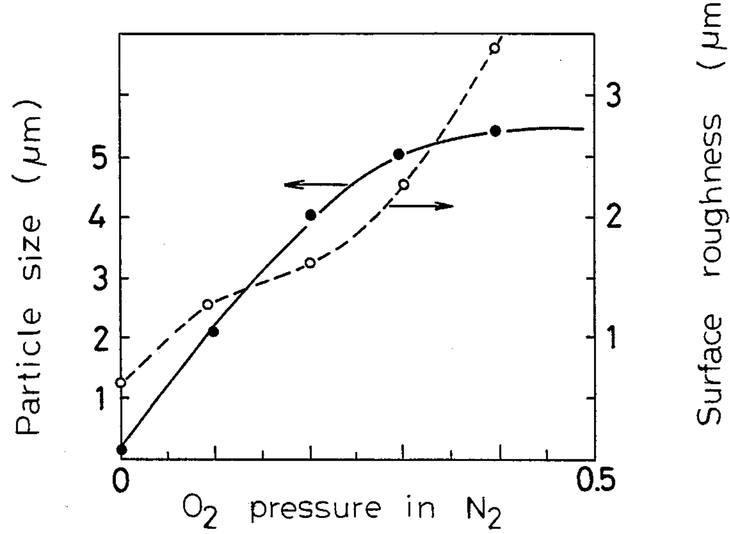
FIG. 5 is a graph showing the relation of the particle size, as well as of the surface roughness, to the $O_2$ partial pressure in $N_2$ used for the heat treatment in the process of the invention.

FIG. 5 shows the dependence of the growth of particles and the surface roughness resulting from the activation heat treatment on the heat-treatment atmosphere. The diagram reveals that as the oxygen partial pressure increases, the particles grow and form particles of as large as 5 μm but the surface roughness lowers to create objections or defects when an electrode is formed on the resulting film. Further if the oxygen partial pressure is low, the growth of particles is inhibited, with the result that the required minimum output (1.0 μA) is not available. According to the present invention, therefore, the photoconductive coating is treated at an oxygen partial pressure of 1/20 to $\frac{1}{4}$.

Figure 6:
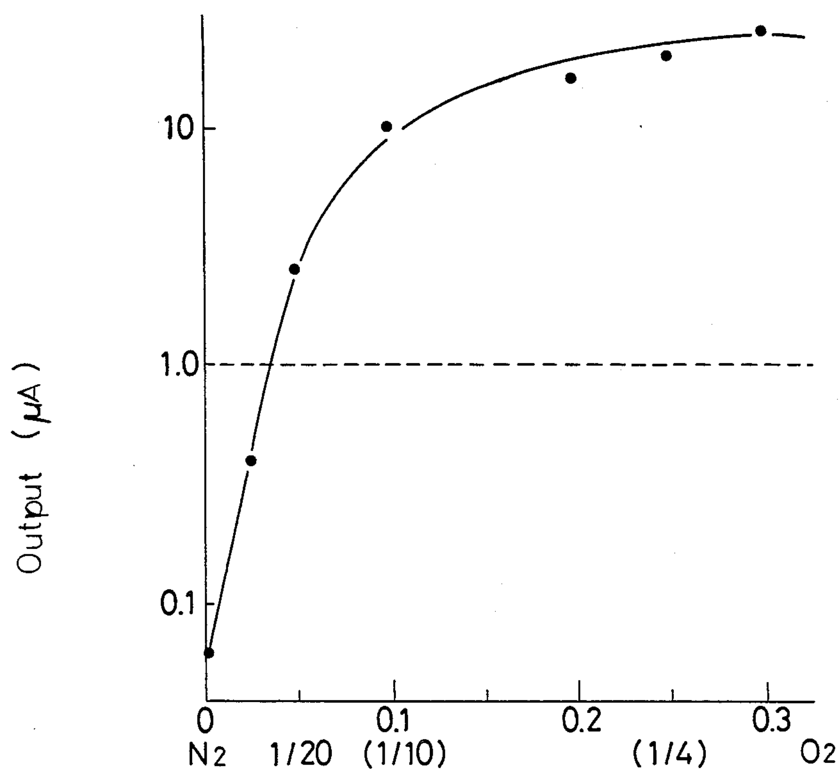
FIG. 6 is a graph showing the relation between the $O_2$ partial pressure and the output.

A planar electrode assembly having an electrode pitch of 125 μm (8 electrodes/mm) was formed on the photoconductive film 2 thus prepared, by the lift-off process. The device was then checked for output characteristics, with the results shown in FIG. 6. The diagram reveals that an output of at least about 5 μA, exceeding the required minimum output of 1.0 μA, is available at an oxygen partial pressure of at least 1/20. The very satisfactory result of at least 10 μA in output and up to 5 msec in response speed was obtained when the oxygen partial pressure was at least 1/10.

Although nitrogen is used as the inert gas in the foregoing examples, the inert gas is not limited to nitrogen; the present invention can of course be practiced with use of other inert gases such as argon, helium and the like.

According to the invention described above, photoelectric conversion films giving a high output with good stability can be produced by controlling the oxygen partial pressure of the heat-treatment atmosphere. Furthermore, electrodes can be formed on these films with an improved yield to provide inexpensive devices.

What is claimed is:

1. A process for producing a photoelectric conversion film comprising:

(a) heat treating a first photoconductive material with a non-sintered coating (A) consisting primarily of a compound selected from the group consisting of CdSe, CdS, CdTe, $CdS_xSe_{1-x}$ and $CdS_xTe_{1-x}$, wherein x is less than 1, and a second photoconductive material with a non-sintered coating (B) consisting primarily of a compound selected from the group consisting of CdS and Cd halides, the first photoconductive material being opposite from the second photoconductive material, at a temperature of 430° C. to 550° C. in an oxygen-containing atmosphere; and (b) thereafter heat treating the first and second photoconductive materials at a temperature of 430° C. to 550° C. in an inert atmosphere.

2. A process as defined in claim 1 wherein the coating (A) is opposite from the coating (B) at a distance of 0.1 to 10 mm therefrom.

3. A process as defined in claim 1 wherein the coating (A) is opposite from the coating (B) at a distance of 0.4 to 0.8 mm.

4. A process as defined in claim 1 wherein the Cd halide is used in an amount of 1 to 10 mole % based on on the CdS.

5. A process as defined in claim 1 wherein the Cd halide is used in an amount of 3 to 8 mole % based the CdS.

6. A process as defined in claim 1 wherein the heat treatment of step (a) is conducted in an oxygen-containing atmosphere having an oxygen partial pressure of $\frac{1}{4}$ to 1/20.

7. A process as defined in claim 1 wherein the heat treatment of step (b) is conducted in an inert gas atmosphere of N2, Ar or He.

8. A process as defined in claim 1 wherein the first photoconductive material is composed chiefly of CdSe.

9. A process as defined in claim 1 wherein the Cd halide is $CdCl_2$.

10. A process as defined in claim 1, wherein the heat treatment of step (a) is conducted at a temperature of 430° C. to 500° C., and the heat treatment of step (b) is conducted at a temperature of 480° C. to 550° C.

* * * * *